(12) United States Patent
Roy et al.

(10) Patent No.: US 8,227,706 B2
(45) Date of Patent: Jul. 24, 2012

(54) COAXIAL PLATED THROUGH HOLES (PTH) FOR ROBUST ELECTRICAL PERFORMANCE

(75) Inventors: Mihir Roy, Chandler, AZ (US); Mahadevan Suryakumar, Gilbert, AZ (US); Yonggang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 661 days.

(21) Appl. No.: 12/347,600

(22) Filed: Dec. 31, 2008

(65) Prior Publication Data

US 2010/0163295 A1    Jul. 1, 2010

(51) Int. Cl.
*H05K 1/11* (2006.01)
(52) U.S. Cl. ..................................................... 174/262
(58) Field of Classification Search ............... 174/262, 174/265
See application file for complete search history.

(56) References Cited

U.S. PATENT DOCUMENTS

| | | | | |
|---|---|---|---|---|
| 3,698,082 A * | 10/1972 | Hyltin et al. | ..................... | 29/856 |
| 6,784,377 B2 * | 8/2004 | Chamberlin et al. | ......... | 174/265 |
| 7,956,713 B2 * | 6/2011 | Chandrasekhar et al. | .... | 336/200 |
| 2003/0085471 A1 * | 5/2003 | Iijima et al. | ..................... | 257/774 |
| 2006/0044083 A1 * | 3/2006 | Kuzmenka | ..................... | 333/246 |
| 2007/0124930 A1 * | 6/2007 | Cheng et al. | ..................... | 29/852 |

* cited by examiner

*Primary Examiner* — Chau Nguyen
(74) *Attorney, Agent, or Firm* — Schwegman, Lundberg & Woessner, P.A.

(57) ABSTRACT

In some embodiments, coaxial plated through holes (PTH) for robust electrical performance are presented. In this regard, an apparatus is introduced comprising an integrated circuit device and a substrate coupled with the integrated circuit device, wherein the substrate includes: a plated through hole, the plated through hole filled with dielectric material and a coaxial copper wire, and conductive traces to separately route the plated through hole and the coaxial copper wire. Other embodiments are also disclosed and claimed.

10 Claims, 5 Drawing Sheets

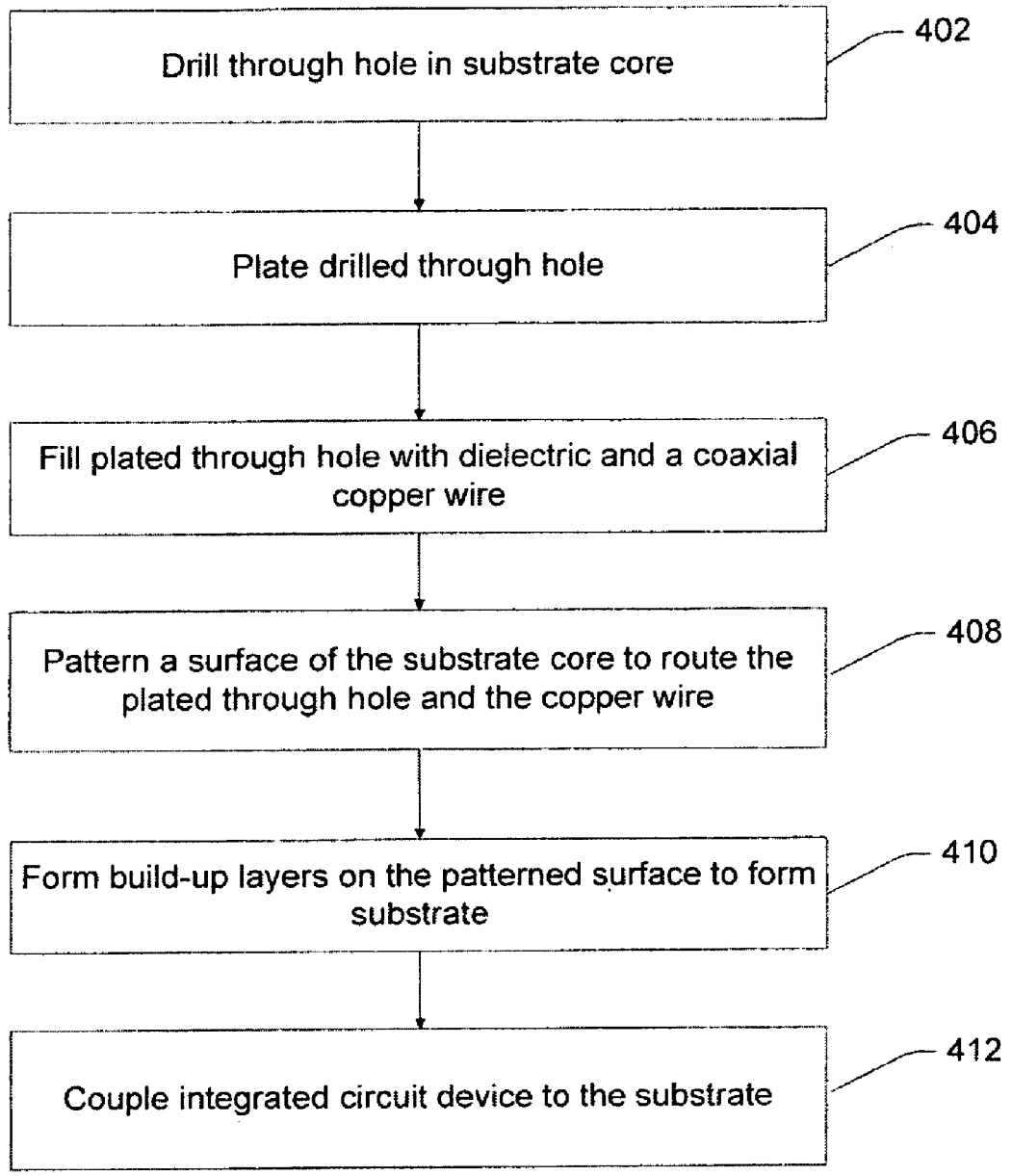

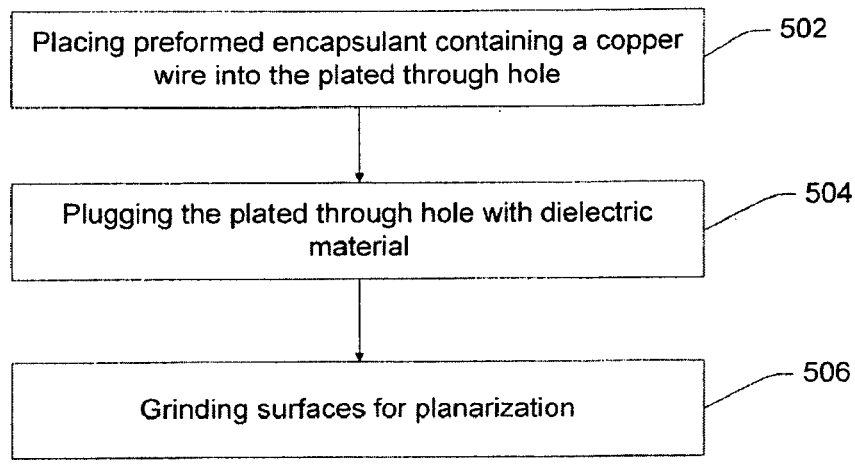
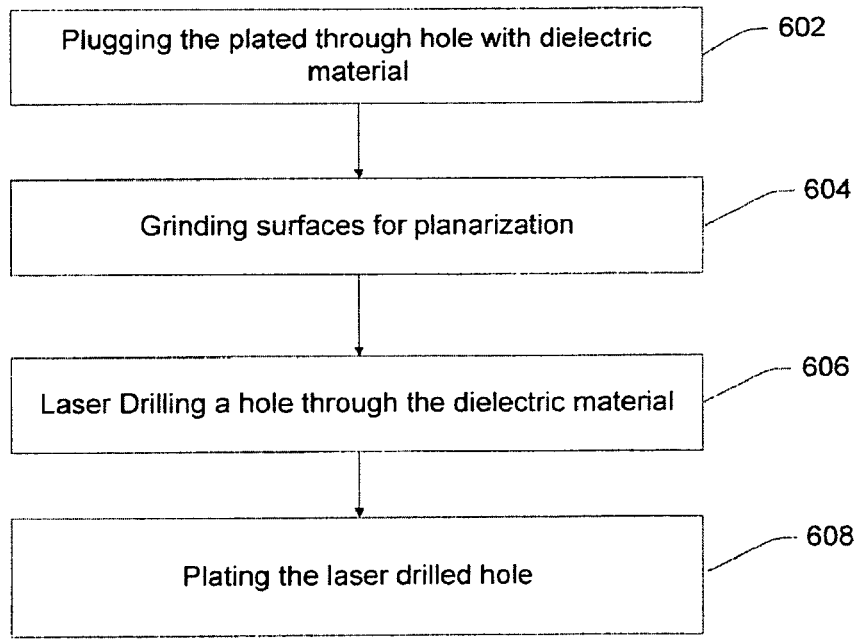

COAXIAL PLATED THROUGH HOLES (PTH) FOR ROBUST ELECTRICAL PERFORMANCE

FIELD OF THE INVENTION

Embodiments of the present invention generally relate to the field of integrated circuit package design and, more particularly, to coaxial plated through holes (PTH) for robust electrical performance.

BACKGROUND OF THE INVENTION

As integrated circuit architecture core count continues to scale up in accordance to Moore's law, the need for high I/O bandwidth and fully integrated voltage regulator design is critical to improve performance. The capacitance between the large plated through holes via pads and surrounding metal bodies causes return loss during high speed data transfer and in addition provides a low quality factor for fully integrated voltage regular designs. While ultra small plated through holes can help improve the return loss, they are currently very costly to manufacture using mechanical drilling process.

BRIEF DESCRIPTION OF THE DRAWINGS

The present invention is illustrated by way of example and not limitation in the figures of the accompanying drawings in which like references indicate similar elements, and in which:

FIG. 4 is a flowchart of an example method of manufacturing an integrated circuit device package with a coaxial plated through hole, in accordance with one example embodiment of the invention;

FIG. 5 is a flowchart of an example method of forming a coaxial plated through hole, in accordance with one example embodiment of the invention;

FIG. 6 is a flowchart of another example method of forming a coaxial plated through hole, in accordance with one example embodiment of the invention.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
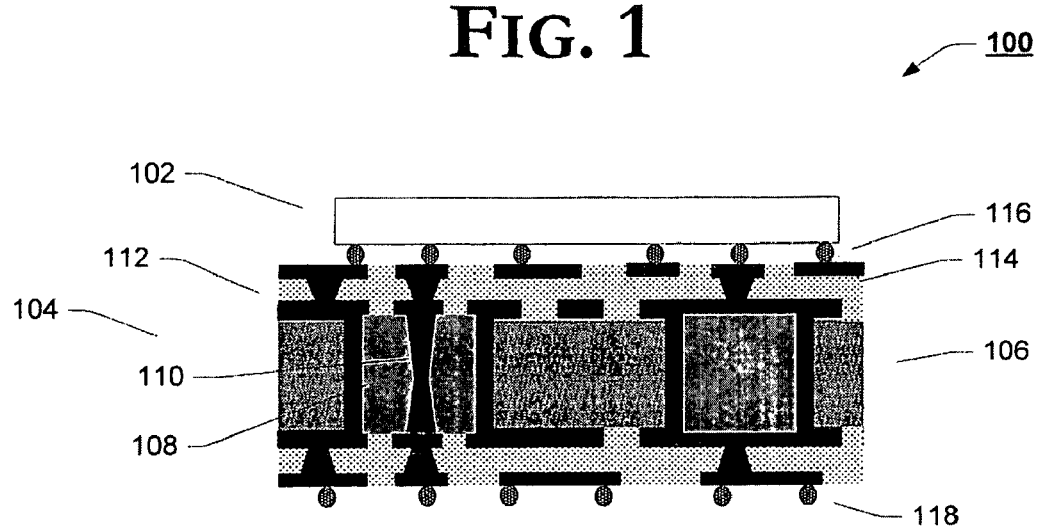
FIG. 1 is a graphical illustration of a cross-sectional view of an integrated circuit device package including a coaxial plated through hole, in accordance with one example embodiment of the invention.

FIG. 1 is a graphical illustration of a cross-sectional view of an integrated circuit device package including a coaxial plated through hole, in accordance with one example embodiment of the invention. As shown, integrated circuit package 100 includes one or more of integrated circuit device 102, package substrate 104, substrate core 106, plated through hole 108, coaxial wire 110, substrate core surface 112, build-up layers 114, device contacts 116, and package contacts 118.

Integrated circuit device 102 is intended to represent any type of integrated circuit die. In one embodiment, integrated circuit device 102 is a multi-core microprocessor. Integrated circuit device 102 includes device contacts 116 to conductively couple with package substrate 104.

Package substrate 104 provides mechanical support for integrated circuit package 100 and includes substrate core 106. Substrate core 106 may itself comprise multiple layers with internal routing (not shown). In one embodiment, substrate core 106 is a four layer substrate core structure. In another embodiment, substrate core 106 is a two layer substrate core structure.

Plated through hole 108 is formed and filled through conventional means. However, plated through hole 108 includes coaxial wire 1 10. In one embodiment, coaxial wire 110 is formed by a method described hereinafter. In another embodiment, coaxial wire 110 is formed by some other means that may subsequently occur to one skilled in the art.

Substrate core surface 112 is patterned to separately route plated through hole 108 and coaxial wire 110. Build-up layers 114 are subsequently disposed on substrate core surface 112 using well known processing methods and include conductive traces to route plated through hole 108 and coaxial wire 110 device contacts 116. In one embodiment, plated through hole 108 and coaxial wire 110 are routed to device contacts 116 that represent differential pair signals of integrated circuit device 102. In one embodiment, plated through hole 108 is routed to a device contact 116 that represents a ground plane of integrated circuit device 102.

Package contacts 118 allow integrated circuit package 100 to be electrically coupled, for example by a socket connection, to a circuit board. In one embodiment, package contacts 118 include solder bumps. In another embodiment, package contacts 118 include lands.

Figure 2A:
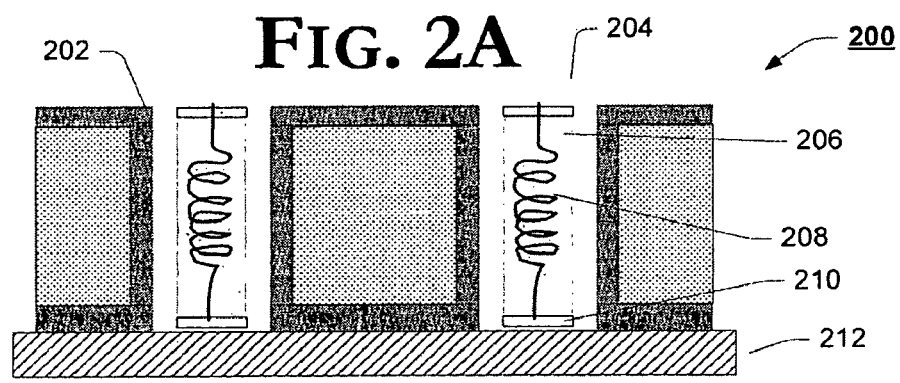
FIGS. 2A-B are graphical illustrations of a cross-sectional view of a partially formed substrate including a coaxial plated through hole, in accordance with one example embodiment of the invention.
Figure 2B:
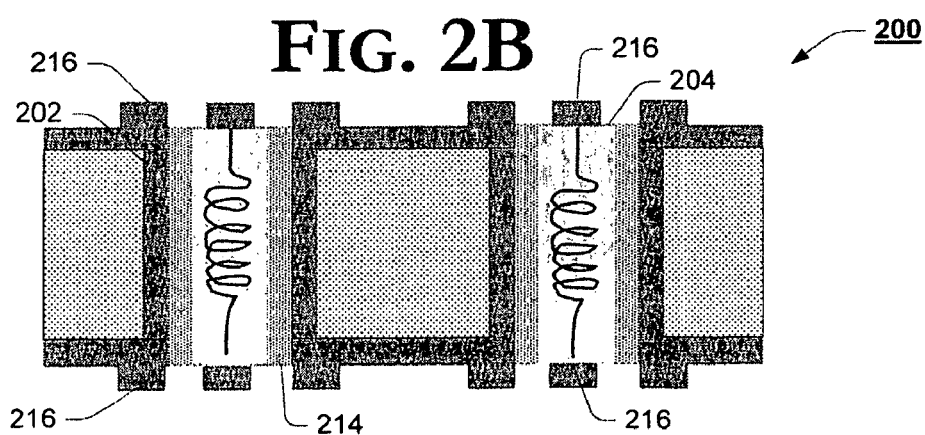

FIGS. 2A-B are graphical illustrations of a cross-sectional view of a partially formed substrate including a coaxial plated through hole, in accordance with one example embodiment of the invention. As shown, substrate 200 includes one or more of plated through hole 202, encapsulant 204, encapsulation material 206, wire 208, encapsulant plug 210, and backboard 212 (FIG. 2A). Encapsulant 204 is formed separately and then placed in plated through hole 202. Encapsulation material 206 may be any type of dielectric material, but preferably would be chosen based on flowing and curing properties. In one embodiment encapsulation material 206 will have low dielectric constant and low permeability for high speed I/O applications. While in another embodiment encapsulation material 206 will be high permeability for fully integrated voltage regulator applications. Wire 208 may be copper or another metal and may be straight or a coiled inductor. Encapsulant plug 210 may be included in encapsulant 204 as part of a manufacturing process. In one embodiment, encapsulant plug 210 is magnetic material and allows encapsulant 204 to be easily picked and placed by magnet. Backboard 212 may be used to hold encapsulant 204 in plated through hole 202 until it can be permanently attached.

After further processing (FIG. 2B) dielectric material 214 plugs the gaps in plated through hole 202 and holds encapsulant 204 in place. In one embodiment, dielectric material 214 is a different material than encapsulation material 206. Also, grinding may have been performed to remove encapsulant plug 210 and patterning may have added metal pads 216 to plated through hole 202 and encapsulant 204. In one embodiment, coiled wire 208 is routed through build-up layers (such as in FIG. 1) and conductively coupled with a power contact of integrated circuit device 102.

Figure 3A:
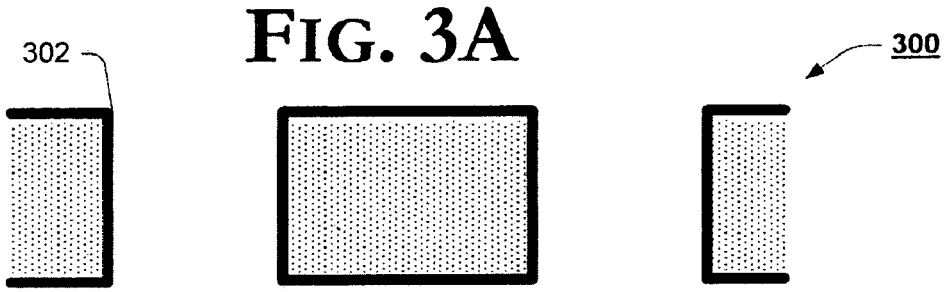
FIGS. 3A-E are graphical illustrations of a cross-sectional view of a partially formed substrate including a coaxial plated through hole, in accordance with one example embodiment of the invention.
Figure 3B:
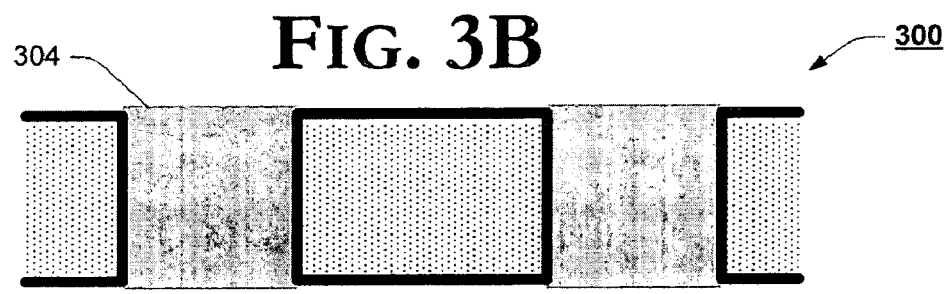
Figure 3C:
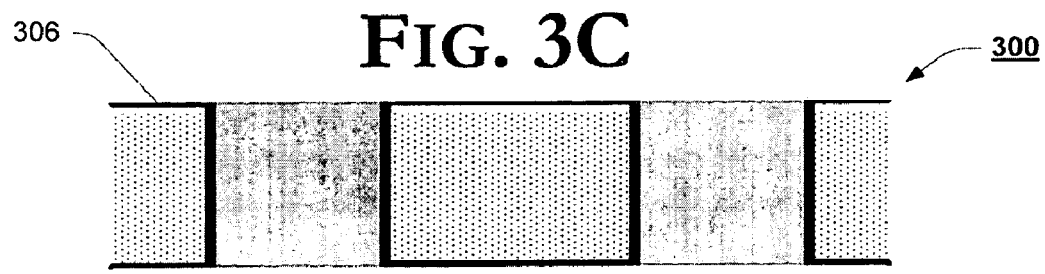
Figure 3D:
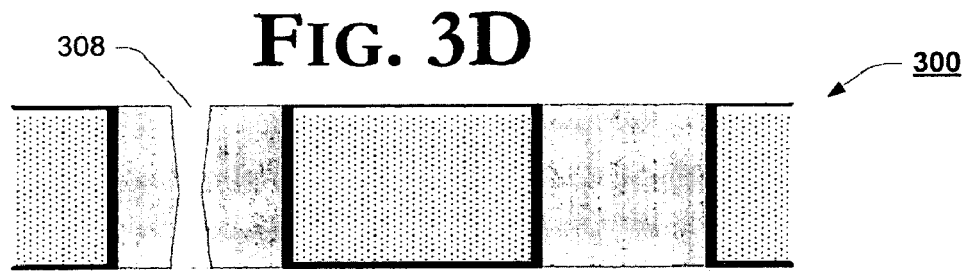
Figure 3E:
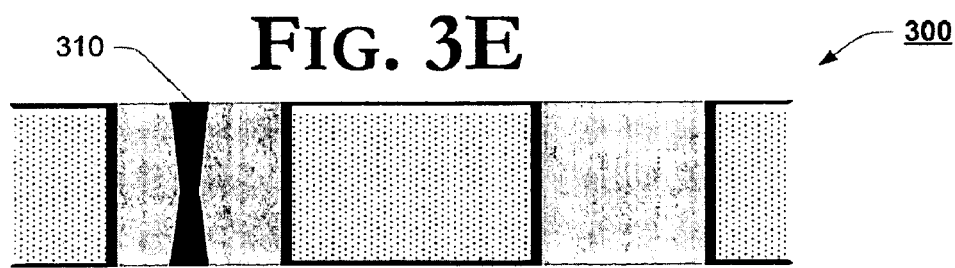

FIGS. 3A-E are graphical illustrations of a cross-sectional view of a partially formed substrate including a coaxial plated through hole, in accordance with one example embodiment of the invention. As shown, substrate 300 includes plated through hole 302 (FIG. 3A) which is filled with dielectric material 304 (FIG. 3B). Surface 306 is planarized mechanically or chemically removing some of dielectric material 304 and, in some cases, some copper from plated through hole 302 (FIG. 3C). Hole 308 is laser drilled through a length of dielectric material 304 (FIG. 3D) which is then filled with copper plating to produce copper wire 310 (FIG. 3E).

FIG. 4 is a flowchart of an example method of manufacturing an integrated circuit device package with a coaxial plated through hole, in accordance with one example embodiment of the invention. As shown, the start of method 400 is to drill (402) and plate (404) plated through hole 108 in substrate core 106. The next step is to fill (406) plated through hole 108 with dielectric and coaxial wire 110. Example embodiments of performing this step are presented in FIGS. 5 and 6, below. The next step is to pattern (408) substrate core surface 112 to route plated through hole 108 and coaxial wire 110. The next step is to form (410) build-up layers 114 on patterned substrate core surface 112 to form package substrate 104. The last step in this example method is to couple (412) integrated circuit device 102 to package substrate 104.

FIG. 5 is a flowchart of an example method of forming a coaxial plated through hole, in accordance with one example embodiment of the invention. As shown, method 406 begins with placing (502) preformed encapsulant 204 containing wire 208 into plated through hole 202. The method continues with plugging (504) plated through hole 202 with dielectric material 214. The method concludes with grinding (506) surfaces for planarization.

FIG. 6 is a flowchart of another example method of forming a coaxial plated through hole, in accordance with one example embodiment of the invention. As shown, method 406 begins with plugging (602) plated through hole 302 with dielectric material 304. The method continues with grinding (604) surface 306 for planarization. This is followed by laser drilling (606) hole 308 through dielectric material 304. The method concludes with plating (608) the laser drilled hole to produce copper wire 310.

Figure 7:
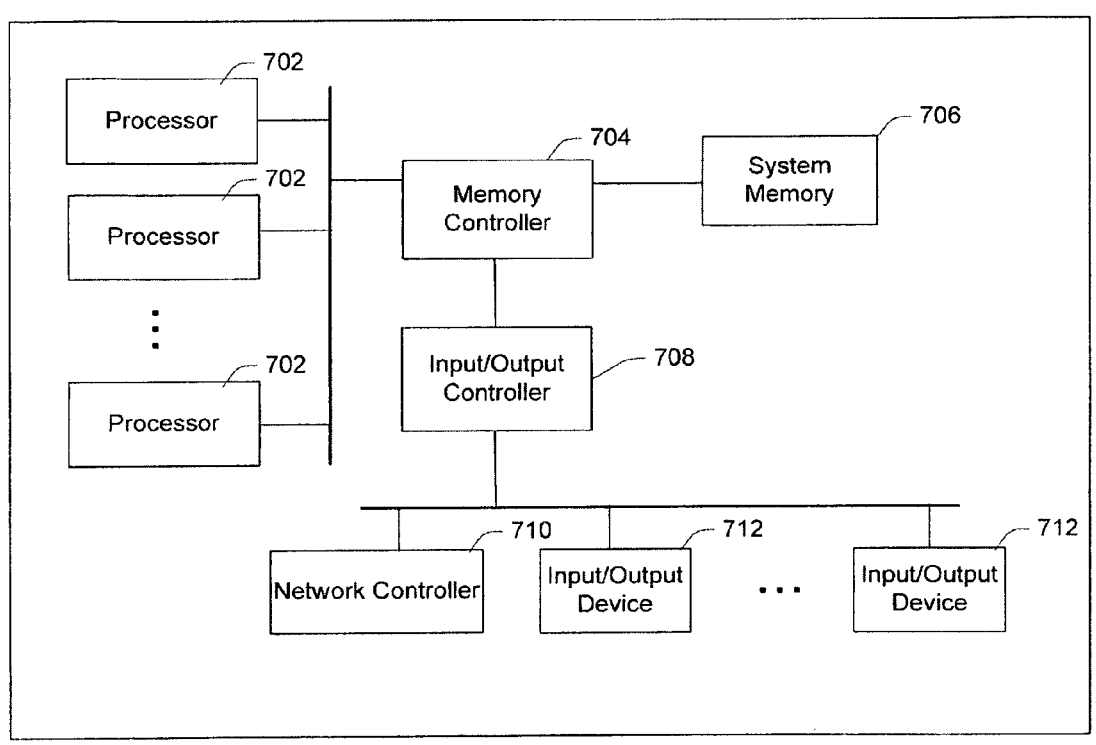
FIG. 7 is a block diagram of an example electronic appliance suitable for implementing coaxial plated through holes, in accordance with one example embodiment of the invention.

FIG. 7 is a block diagram of an example electronic appliance suitable for implementing coaxial plated through holes, in accordance with one example embodiment of the invention. Electronic appliance 700 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 700 may include one or more of processor(s) 702, memory controller 704, system memory 706, input/output controller 708, network controller 710, and input/output device(s) 712 coupled as shown in FIG. 7. Processor(s) 702, or other integrated circuit components of electronic appliance 700, may comprise a substrate with coaxial plated through holes as described previously as an embodiment of the present invention.

Processor(s) 702 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 702 are Intel® compatible processors. Processor(s) 702 may have an instruction set containing a plurality of machine level instructions that may be invoked, for example by an application or operating system.

Memory controller 704 may represent any type of chipset or control logic that interfaces system memory 706 with the other components of electronic appliance 700. In one embodiment, the connection between processor(s) 702 and memory controller 704 may be a point-to-point serial link. In another embodiment, memory controller 704 may be referred to as a north bridge.

System memory 706 may represent any type of memory device(s) used to store data and instructions that may have been or will be used by processor(s) 702. Typically, though the invention is not limited in this respect, system memory 706 will consist of dynamic random access memory (DRAM). In one embodiment, system memory 706 may consist of Rambus DRAM (RDRAM). In another embodiment, system memory 706 may consist of double data rate synchronous DRAM (DDRSDRAM).

Input/output (I/O) controller 708 may represent any type of chipset or control logic that interfaces I/O device(s) 712 with the other components of electronic appliance 700. In one embodiment, I/O controller 708 may be referred to as a south bridge. In another embodiment, I/O controller 708 may comply with the Peripheral Component Interconnect (PCI) Express™ Base Specification, Revision 1.0a, PCI Special Interest Group, released Apr. 15, 2003.

Network controller 710 may represent any type of device that allows electronic appliance 700 to communicate with other electronic appliances or devices. In one embodiment, network controller 710 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 710 may be an Ethernet network interface card.

Input/output (I/O) device(s) 712 may represent any type of device, peripheral or component that provides input to or processes output from electronic appliance 700.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising:
an integrated circuit device; and
a substrate coupled with the integrated circuit device, wherein the substrate includes: a plated through hole, the plated through hole filled with dielectric material and a coaxial copper wire, wherein the coaxial copper wire comprises an inductor; conductive traces to separately route the plated through hole and the coaxial copper wire; and a plug in an end of the plated through hole, wherein the plug comprises magnetic material.

2. The apparatus of claim 1, further comprising the conductive traces conductively coupled with differential pair contacts of the integrated circuit device.

3. The apparatus of claim 1, further comprising the plated through hole conductively coupled with a ground contact of the integrated circuit device.

4. The apparatus of claim 1, further comprising a second dielectric material filling the plated through hole.

5. The apparatus of claim 1, further comprising the coaxial copper wire conductively coupled with a power contact of the integrated circuit device.

6. An electronic appliance comprising:
a network controller;
a system memory; and
a processor, wherein the processor comprises:
an integrated circuit device; and
a substrate coupled with the integrated circuit device, wherein the substrate includes
a plated through hole;
dielectric material filling the plated through hole;
a coaxial wire within the dielectric material, wherein the coaxial copper wire comprises an inductor;
conductive traces separately routing the plated through hole and the coaxial copper wire to contacts of the integrated circuit device; and
a plug in an end of the plated through hole, wherein the plug comprises magnetic material.

7. The electronic appliance of claim 6, further comprising the conductive traces conductively coupled with differential pair contacts of the integrated circuit device.

8. The electronic appliance of claim 6, further comprising the plated through hole conductively coupled with a ground contact of the integrated circuit device.

9. The electronic appliance of claim 6, further comprising a second dielectric material filling the plated through hole.

10. The electronic appliance of claim 6, further comprising the coaxial wire conductively coupled with a power contact of the integrated circuit device.

* * * * *